US008491720B2

(12) United States Patent
Ishikawa et al.

(10) Patent No.: US 8,491,720 B2
(45) Date of Patent: Jul. 23, 2013

(54) HVPE PRECURSOR SOURCE HARDWARE

(75) Inventors: Tetsuya Ishikawa, Saratoga, CA (US);
David H. Quach, San Jose, CA (US);
Anzhong Chang, San Jose, CA (US);
Olga Kryliouk, Sunnyvale, CA (US);
Yuriy Melnik, Santa Clara, CA (US);
Harsukhdeep S. Ratia, Santa Clara, CA (US); Son T. Nguyen, San Jose, CA (US); Lily Pang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 890 days.

(21) Appl. No.: 12/637,028

(22) Filed: Dec. 14, 2009

(65) Prior Publication Data

US 2010/0258052 A1 Oct. 14, 2010

Related U.S. Application Data

(60) Provisional application No. 61/168,399, filed on Apr. 10, 2009, provisional application No. 61/172,630, filed on Apr. 24, 2009, provisional application No. 61/230,877, filed on Aug. 3, 2009.

(51) Int. Cl.
| | |
|---|---|
| *C23C 16/455* | (2006.01) |
| *C23F 1/00* | (2006.01) |
| *H01L 21/306* | (2006.01) |
| *C23C 16/06* | (2006.01) |
| *C23C 22/02* | (2006.01) |

(52) U.S. Cl.
USPC ........ 118/715; 118/728; 118/50; 156/345.33; 156/345.34; 156/345.36; 156/345.37; 137/262; 137/263; 137/264; 137/454.2; 137/560; 141/285; 141/286; 141/37; 141/44; 141/45; 261/127; 261/131; 261/146; 261/147

(58) Field of Classification Search
USPC .......... 118/715, 728, 50; 156/345.29, 345.33, 156/345.34, 345.35, 345.36, 345.26, 345.51
See application file for complete search history.

(56) References Cited

U.S. PATENT DOCUMENTS

| | | | |
|---|---|---|---|
| 3,063,867 A | 11/1962 | Emery, Jr. | |
| 4,286,436 A * | 9/1981 | Engdahl et al. | 62/123 |

(Continued)

FOREIGN PATENT DOCUMENTS

| | | |
|---|---|---|
| CN | 1423834 | 6/2003 |
| JP | 2004-140328 A | 5/2004 |

(Continued)

OTHER PUBLICATIONS

Office Action, U.S. Appl. No. 11/925,615 dated Nov. 19, 2010.

(Continued)

*Primary Examiner* — Rudy Zervigon
(74) *Attorney, Agent, or Firm* — Patterson & Sheridan, LLP

(57) ABSTRACT

Embodiments disclosed herein generally relate to an HVPE chamber. The chamber may have two separate precursor sources coupled thereto to permit two separate layers to be deposited. For example, a gallium source and a separate aluminum source may be coupled to the processing chamber to permit gallium nitride and aluminum nitride to be separately deposited onto a substrate in the same processing chamber. The nitrogen may be introduced to the processing chamber at a separate location from the gallium and the aluminum and at a lower temperature. The different temperatures causes the gases to mix together, react and deposit on the substrate with little or no deposition on the chamber walls.

20 Claims, 8 Drawing Sheets

U.S. PATENT DOCUMENTS

| | | | |
|---|---|---|---|
| 4,750,975 A * | 6/1988 | Parker et al. | 202/154 |
| 4,851,295 A | 7/1989 | Brors | |
| 5,037,624 A * | 8/1991 | Tom et al. | 423/210 |
| D329,839 S | 9/1992 | Ehrhart | |
| 5,273,588 A | 12/1993 | Foster et al. | |
| 5,348,911 A | 9/1994 | Jurgensen et al. | |
| 5,359,788 A | 11/1994 | Gell, Jr. | |
| 5,636,320 A | 6/1997 | Yu et al. | |
| 5,647,911 A | 7/1997 | Vanell et al. | |
| 5,667,592 A | 9/1997 | Boitnott et al. | |
| 5,715,361 A | 2/1998 | Moslehi | |
| 5,762,755 A | 6/1998 | McNeilly et al. | |
| 5,814,239 A | 9/1998 | Kaneko et al. | |
| 5,827,427 A * | 10/1998 | Hansen | 210/232 |
| 5,855,675 A | 1/1999 | Doering et al. | |
| 5,858,471 A | 1/1999 | Ray et al. | |
| 5,871,586 A | 2/1999 | Crawley et al. | |
| 6,086,673 A | 7/2000 | Molnar | |
| 6,089,027 A * | 7/2000 | Wang et al. | 62/46.1 |
| 6,090,285 A * | 7/2000 | Chau | 210/284 |
| 6,156,581 A | 12/2000 | Vaudo et al. | |
| 6,179,913 B1 | 1/2001 | Solomon et al. | |
| 6,200,893 B1 | 3/2001 | Sneh | |
| 6,206,972 B1 | 3/2001 | Dunham | |
| 6,265,311 B1 * | 7/2001 | Hautala et al. | 438/680 |
| 6,268,288 B1 * | 7/2001 | Hautala et al. | 438/680 |
| 6,270,569 B1 * | 8/2001 | Shibata et al. | 117/68 |
| 6,274,495 B1 | 8/2001 | Omstead et al. | |
| 6,286,451 B1 | 9/2001 | Ishikawa et al. | |
| 6,305,314 B1 | 10/2001 | Sneh et al. | |
| 6,309,465 B1 | 10/2001 | Jurgensen et al. | |
| 6,355,107 B1 | 3/2002 | Solomon et al. | |
| 6,410,432 B1 * | 6/2002 | Hautala et al. | 438/680 |
| 6,410,433 B1 * | 6/2002 | Hautala et al. | 438/680 |
| 6,413,860 B1 * | 7/2002 | Hautala et al. | 438/680 |
| 6,444,038 B1 * | 9/2002 | Rangarajan et al. | 118/715 |
| 6,451,119 B2 | 9/2002 | Sneh et al. | |
| 6,451,695 B2 | 9/2002 | Sneh | |
| 6,451,713 B1 | 9/2002 | Tay et al. | |
| 6,464,843 B1 | 10/2002 | Wicker et al. | |
| 6,475,902 B1 * | 11/2002 | Hausmann et al. | 438/627 |
| 6,475,910 B1 | 11/2002 | Sneh | |
| 6,503,330 B1 | 1/2003 | Sneh et al. | |
| 6,508,197 B1 | 1/2003 | Omstead et al. | |
| 6,517,634 B2 | 2/2003 | Pang et al. | |
| 6,527,865 B1 * | 3/2003 | Sajoto et al. | 118/715 |
| 6,528,394 B1 | 3/2003 | Lee | |
| 6,533,874 B1 | 3/2003 | Vaudo et al. | |
| 6,540,838 B2 | 4/2003 | Sneh et al. | |
| 6,551,399 B1 | 4/2003 | Sneh et al. | |
| 6,562,720 B2 | 5/2003 | Thilderkvist et al. | |
| 6,562,730 B2 | 5/2003 | Jeng et al. | |
| 6,569,765 B1 | 5/2003 | Solomon et al. | |
| 6,602,784 B2 | 8/2003 | Sneh | |
| 6,616,766 B2 | 9/2003 | Dunham | |
| 6,616,870 B1 | 9/2003 | Goela et al. | |
| 6,630,401 B2 | 10/2003 | Sneh | |
| 6,638,859 B2 | 10/2003 | Sneh et al. | |
| 6,638,862 B2 | 10/2003 | Sneh | |
| 6,648,966 B2 | 11/2003 | Maruska et al. | |
| 6,660,083 B2 | 12/2003 | Tsvetkov et al. | |
| 6,733,591 B2 | 5/2004 | Anderson | |
| 6,743,473 B1 * | 6/2004 | Parkhe et al. | 427/252 |
| 6,840,252 B2 * | 1/2005 | Zorich et al. | 134/95.1 |
| 6,849,241 B2 | 2/2005 | Dauelsberg et al. | |
| 6,897,119 B1 | 5/2005 | Sneh et al. | |
| 6,900,129 B2 * | 5/2005 | Hautala et al. | 438/680 |
| 6,902,990 B2 | 6/2005 | Gottfried et al. | |
| 6,905,547 B1 | 6/2005 | Londergan et al. | |
| 6,911,065 B2 * | 6/2005 | Watanabe et al. | 95/90 |
| 6,921,062 B2 * | 7/2005 | Gregg et al. | 261/23.1 |
| 6,921,437 B1 | 7/2005 | DeDontney et al. | |
| 6,927,426 B2 | 8/2005 | Matsuoka et al. | |
| 6,962,624 B2 | 11/2005 | Jurgensen et al. | |
| 6,964,876 B2 | 11/2005 | Heuken | |
| 6,972,050 B2 | 12/2005 | Bremser et al. | |
| 6,983,620 B2 | 1/2006 | Kaeppeler | |
| 6,998,152 B2 * | 2/2006 | Uhlenbrock | 427/248.1 |
| 7,018,940 B2 | 3/2006 | Dunham | |
| 7,033,921 B2 | 4/2006 | Jurgensen | |
| 7,078,318 B2 | 7/2006 | Jurgensen et al. | |
| 7,115,896 B2 | 10/2006 | Guo et al. | |
| 7,128,785 B2 | 10/2006 | Kaeppeler et al. | |
| 7,147,718 B2 | 12/2006 | Jurgensen et al. | |
| 7,170,095 B2 | 1/2007 | Vaudo et al. | |
| 7,172,646 B2 * | 2/2007 | Tempel et al. | 95/241 |
| 7,364,991 B2 | 4/2008 | Bour et al. | |
| 7,368,368 B2 | 5/2008 | Emerson | |
| 7,396,381 B2 * | 7/2008 | Graham et al. | 95/46 |
| 7,413,649 B2 * | 8/2008 | Bittner | 210/108 |
| 7,527,742 B2 | 5/2009 | Tysoe et al. | |
| 7,556,688 B2 * | 7/2009 | Melnik et al. | 117/99 |
| 7,585,415 B2 * | 9/2009 | Wyse et al. | 210/639 |
| 7,625,448 B2 | 12/2009 | Dauelsberg et al. | |
| 7,638,058 B2 * | 12/2009 | Wyse et al. | 210/634 |
| 7,670,490 B2 * | 3/2010 | Wyse et al. | 210/634 |
| 7,682,940 B2 | 3/2010 | Ye et al. | |
| 7,803,337 B1 * | 9/2010 | St. Amant et al. | 423/210 |
| 7,827,932 B2 * | 11/2010 | Kojima et al. | 118/723 VE |
| 7,896,954 B2 * | 3/2011 | Wyse et al. | 95/149 |
| 7,901,576 B2 * | 3/2011 | Stolarik et al. | 210/279 |
| 7,938,968 B2 * | 5/2011 | Wyse et al. | 210/660 |
| 7,967,911 B2 * | 6/2011 | Carlson et al. | 118/726 |
| 8,083,945 B2 * | 12/2011 | Wyse et al. | 210/634 |
| 8,118,939 B2 * | 2/2012 | Atlas et al. | 118/726 |
| 8,313,804 B2 * | 11/2012 | Carlson et al. | 427/248.1 |
| 2001/0050059 A1 | 12/2001 | Hongo et al. | |
| 2002/0013051 A1 * | 1/2002 | Hautala et al. | 438/680 |
| 2002/0078894 A1 * | 6/2002 | Timmons et al. | 118/726 |
| 2002/0164423 A1 | 11/2002 | Chiang et al. | |
| 2003/0116019 A1 * | 6/2003 | Torkaman | 95/226 |
| 2003/0126991 A1 * | 7/2003 | Wang et al. | 96/108 |
| 2003/0129306 A1 * | 7/2003 | Wade et al. | 427/255.28 |
| 2003/0192430 A1 * | 10/2003 | Pearlstein et al. | 95/90 |
| 2004/0016404 A1 * | 1/2004 | Gregg et al. | 118/726 |
| 2004/0206241 A1 * | 10/2004 | Tempel et al. | 96/155 |
| 2004/0221809 A1 | 11/2004 | Ohmi et al. | |
| 2004/0224505 A1 * | 11/2004 | Nguyen et al. | 438/681 |
| 2005/0066893 A1 * | 3/2005 | Soininen | 118/715 |
| 2005/0239675 A1 * | 10/2005 | Makansi | 510/223 |
| 2005/0266281 A1 * | 12/2005 | Adams et al. | 429/17 |
| 2005/0276733 A1 * | 12/2005 | Tempel et al. | 422/211 |
| 2006/0008392 A1 * | 1/2006 | Graham et al. | 422/168 |
| 2006/0021568 A1 | 2/2006 | Matsumoto | |
| 2006/0060289 A1 * | 3/2006 | Carter et al. | 156/187 |
| 2006/0154455 A1 | 7/2006 | Guo et al. | |
| 2006/0162661 A1 | 7/2006 | Jung et al. | |
| 2006/0205199 A1 | 9/2006 | Baker et al. | |
| 2006/0226074 A1 * | 10/2006 | Wyse et al. | 210/634 |
| 2007/0010033 A1 | 1/2007 | Aderhold et al. | |
| 2007/0259502 A1 | 11/2007 | Bour et al. | |
| 2008/0050889 A1 | 2/2008 | Bour et al. | |
| 2008/0206464 A1 | 8/2008 | Kappeler | |
| 2008/0210633 A1 * | 9/2008 | Wyse et al. | 210/638 |
| 2008/0211118 A1 * | 9/2008 | Wyse et al. | 261/75 |
| 2009/0039009 A1 * | 2/2009 | Stolarik et al. | 210/284 |
| 2009/0149008 A1 | 6/2009 | Kryliouk et al. | |
| 2009/0194026 A1 | 8/2009 | Burrows et al. | |
| 2010/0258049 A1 * | 10/2010 | Ishikawa et al. | 117/98 |
| 2010/0258052 A1 * | 10/2010 | Ishikawa et al. | 118/715 |
| 2010/0263746 A1 * | 10/2010 | Stolarik et al. | 137/561 A |
| 2012/0267388 A1 * | 10/2012 | Tom et al. | 222/1 |

FOREIGN PATENT DOCUMENTS

| | | |
|---|---|---|
| JP | 2007-039272 A | 2/2007 |
| JP | 2007-154297 A | 6/2007 |
| JP | D1304483 | 6/2007 |
| JP | 2008-066490 A | 3/2008 |
| JP | D1361441 | 6/2009 |
| KR | 10-0578089 B1 | 5/2006 |
| TW | 555877 B | 10/2003 |
| WO | WO-2009099721 A2 | 8/2009 |

OTHER PUBLICATIONS

Motoki, et al. "Preparation of Large Freestanding GaN Substrates by Hydride Vapor Phase Epitaxy Using GaAs as a Starting Substrate", JP Appl. Phys. vol. 40 (2001) pp. L140-L143. Part 2. No. 2B. Feb. 15, 2001.

Kikuchi, et al. "Thermodynamic Analysis of Various Types of Hydride Vapor Phase Epitaxy System for High-Speed Growth of InN", 2006, Japanese Journal of Appiled Physics, vol. 45 No. 45, pp. L1203-L1205.

Kelly, et al. "Large Free-Standing GaN Substrates by Hydride Vapor Phase Epitaxy and Laser-Induced Liftoff", JP Appl. Phys. vol. 38 (1999) pp. L217-L219. Part 2. No. 3A. Mar. 1, 1999.

Park, et al. "Free-Standing GaN Substrates by Hydride Vapor Phase Epitaxy", JP Appl. Phys. vol. 39 (2000) pp. L1141-L1142. Part 2. No. 11B. Nov. 15, 2000.

Ban, Vladimir S. "Mass Spectrometric Studies of Vapor-Phase Crystal Growth", vol. 119, Issue 6. pp. 761-765. Jun. 1972.

Office Action, U.S. Appl. No. 11/767,520 dated Sep. 8, 2010.

International Search Report, PCT/US2010/032032 dated Nov. 26, 2010.

Chinese Office Action for Application No. 200810168234.1 dated Aug. 16, 2010.

International Search Report, PCT/US2010/032313 dated Dec. 6, 2010.

Bohnen, et al, "Enhanced Growth Rates and Reduced Parasitic Deposition by the Substitution of $Cl_2$ for HCl1 in GaN HVPE", Journal of Crystal Growth 312 (2010) 2542-2550.

International search report and written opinion for PCT/US2010/030492 dated Oct. 27, 2010.

International search report and written opinion for PCT/US2010/030496 dated Oct. 27, 2010.

International search report and written opinion for PCT/US2010/032597 dated Dec. 1, 2010.

Office action for Taiwan patent application No. 099301936 dated Sep. 27, 2010.

* cited by examiner

HVPE PRECURSOR SOURCE HARDWARE

CROSS-REFERENCE TO RELATED APPLICATIONS

This application claims benefit of U.S. Provisional Patent Application Ser. No. 61/168,399, filed Apr. 10, 2009, U.S. Provisional Patent Application Ser. No. 61/172,630, filed Apr. 24, 2009, and U.S. Provisional Patent Application Ser. No. 61/230,877, filed Aug. 3, 2009. Each of the aforementioned patent applications is herein incorporated by reference.

BACKGROUND OF THE INVENTION

1. Field of the Invention

Embodiments disclosed herein generally relate to a hydride vapor phase epitaxy (HVPE) chamber.

2. Description of the Related Art

Group-III nitride semiconductors are finding greater importance in the development and fabrication of short wavelength light emitting diodes (LEDs), laser diodes (LDs), and electronic devices including high power, high frequency, and high temperature transistors and integrated circuits. One method that has been used to deposit Group-III nitrides is HVPE. In HVPE, a hydride gas reacts with the Group-III metal which then reacts with a nitrogen precursor to form the Group-III metal nitride.

As the demand for LEDs, LDs, transistors, and integrated circuits increases, the efficiency of depositing the Group-III metal nitride takes on greater importance. Therefore, there is a need in the art for an improved HVPE deposition method and an HVPE apparatus.

SUMMARY OF THE INVENTION

Embodiments disclosed herein generally relate to an HVPE chamber. The chamber may have one or more precursor sources coupled thereto. When two separate precursor sources are coupled thereto, two separate layers may be deposited in the same chamber. For example, a gallium source and a separate aluminum source may be coupled to the processing chamber to permit gallium nitride and aluminum nitride to be separately deposited onto a substrate in the same processing chamber. In one embodiment, five precursor sources may be coupled to the chamber. Such precursor sources are capable of dispensing precursors such as gallium, indium, aluminum, silicon, and magnesium. When the precursors are used to form a nitrogen containing compound, a nitrogen containing gas such as $NH_3$ may be used. The nitrogen may be introduced to the processing chamber at a separate location from the gallium and the aluminum and at a lower temperature. The geometry of the chamber may be set such that the precursor and the reactive gas are introduced to the chamber separately to avoid high concentration mixing. The chamber inertia is designed to mix the gases by flow, diffusion and convection. In one embodiment, the different temperatures cause the gases to mix together, react and deposit on the substrate with little or no deposition on the chamber walls.

In one embodiment, an apparatus is disclosed. The apparatus includes a vacuum chamber body and a first precursor source disposed adjacent to the vacuum chamber body and coupled to the vacuum chamber body. The first precursor source includes a first precursor source body, a first support liner disposed in the first precursor source body, a float liner coupled to the first support liner and disposed in the first precursor source body and a float disposed in the first precursor source body. The float is movable from a first position spaced a first distance from the float liner to a second position spaced a second distance from the float liner. The first distance is greater than the second distance. The apparatus also includes a second precursor source disposed adjacent the vacuum chamber body and coupled to the vacuum chamber body, the second precursor source separate from the first precursor source body.

In another embodiment, an apparatus is disclosed. The apparatus includes a vacuum chamber body and a first precursor source disposed adjacent to the vacuum chamber body and coupled to the vacuum chamber body. The first precursor source includes a first precursor source body, a first support liner disposed in the first precursor source body, and a showerhead disposed in the first precursor body and coupled to the first support liner. The apparatus also includes a second precursor source disposed adjacent the vacuum chamber body and coupled to the vacuum chamber body. The second precursor source is separate from the first precursor source body.

In another embodiment, an apparatus is disclosed. The apparatus includes a vacuum chamber body and a first precursor source disposed adjacent to the vacuum chamber body and coupled to the vacuum chamber body. The first precursor source includes a first precursor source body, a first support liner disposed in the first precursor source body, a float liner coupled to the first support liner and disposed in the first precursor source body, and a float disposed in the first precursor source body. The float is movable from a first position spaced a first distance from the float liner to a second position spaced a second distance from the float liner. The first distance is greater than the second distance. The apparatus also includes a second precursor source disposed adjacent the vacuum chamber body and coupled to the vacuum chamber body. The second precursor source is separate from the first precursor source body. The second precursor source includes a second precursor source body, a second support liner disposed in the first precursor source body, and a showerhead disposed in the first precursor body and coupled to the first support liner.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to an HVPE chamber. The chamber may have one or more precursor sources coupled thereto. When two separate precursor sources are coupled thereto, two separate layers may be deposited. For example, a gallium source and a separate aluminum source may be coupled to the processing chamber to permit gallium nitride and aluminum nitride to be separately deposited onto a substrate in the same processing chamber. In one embodiment, five precursor sources may be coupled to the chamber. Such precursor sources are capable of dispensing precursors such as gallium, indium, aluminum, silicon, and magnesium. When the precursors are used to form a nitrogen containing compound, a nitrogen containing gas such as $NH_3$ may be used. The nitrogen may be introduced to the processing chamber at a separate location from the gallium and the aluminum and at a lower temperature. The geometry of the chamber may be set such that the precursor and the reactive gas are introduced to the chamber separately to avoid high concentration mixing. The chamber inertia is designed to mix the gases by flow, diffusion and convection. In one embodiment, the different temperatures cause the gases to mix together, react and deposit on the substrate with little or no deposition on the chamber walls. In addition, the chamber is equipped with MO source delivery system. In addition, the chamber is equipped with active species generator such as plasma down stream, gas heater, hot wire, etc.

Figure 1:
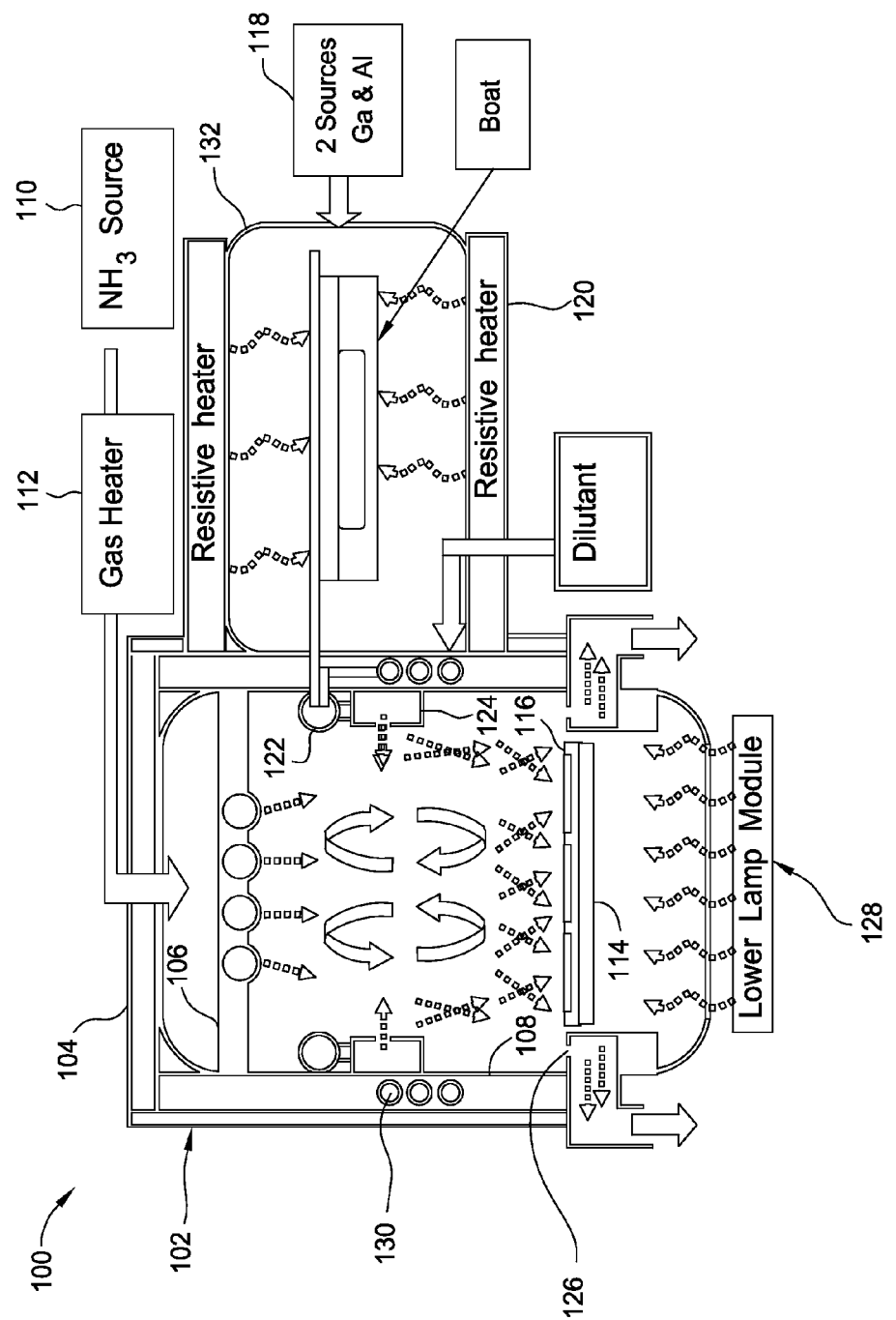
FIG. 1 is a schematic view of an HVPE apparatus 100 according to one embodiment.

FIG. 1 is a schematic view of an HVPE apparatus 100 according to one embodiment. The apparatus 100 includes a chamber 102 enclosed by a lid 104. Processing gas from a first gas source 110 is delivered to the chamber 102 through a gas distribution showerhead 106. In one embodiment, the gas source 110 may comprise a nitrogen containing compound. In another embodiment, the gas source 110 may comprise ammonia. In one embodiment, an inert gas such as helium or diatomic nitrogen may be introduced as well either through the gas distribution showerhead 106 or through the walls 108 of the chamber 102. An energy source 112 may be disposed between the gas source 110 and the gas distribution showerhead 106. In one embodiment, the energy source 112 may comprise a heater. The energy source 112 may break up the gas from the gas source 110, such as ammonia, so that the nitrogen from the nitrogen containing gas is more reactive.

To react with the gas from the first source 110, precursor material may be delivered from one or more second sources 118. The one or more second sources 118 may comprise precursors such as gallium and aluminum. It is to be understood that while reference will be made to two precursors, more or less precursors may be delivered as discussed above. In one embodiment, the precursor comprises gallium present in the one or more second sources 118 in liquid form. In one embodiment, the precursor present in the one or more second sources 118 may be in liquid form. In another embodiment, the precursor may be present in the one or more second sources in solid form or solid powder form. In another embodiment, the precursor comprises aluminum present in the precursor source 118 in solid form. In one embodiment, the aluminum precursor may be in solid, powder form. The precursor may be delivered to the chamber 102 by flowing a reactive gas over and/or through the precursor in the precursor source 118. In one embodiment, the reactive gas may comprise a halogen gas. In one embodiment, the reactive gas may comprise a chlorine containing gas such as diatomic chlorine. The chlorine containing gas may react with the precursor source such as gallium or aluminum to form a chloride. In one embodiment, the one or more second sources 118 may comprise eutectic materials and their alloys. In another embodiment, the HVPE apparatus 100 may be arranged to handle doped sources as well as at least one intrinsic source to control the dopant concentration.

In order to increase the effectiveness of the chlorine containing gas to react with the precursor, the chlorine containing gas may snake through the boat area in the chamber 132 and be heated with the resistive heater 120. By increasing the residence time that the chlorine containing gas is snaked through the chamber 132, the temperature of the chlorine containing gas may be controlled. By increasing the temperature of the chlorine containing gas, the chlorine may react with the precursor faster. In other words, the temperature is a catalyst to the reaction between the chlorine and the precursor.

In order to increase the reactiveness of the precursor, the precursor may be heated by a resistive heater 120 within the second chamber 132 in a boat. For example, in one embodiment, the gallium precursor may be heated to a temperature of between about 750 degrees Celsius to about 850 degrees Celsius. The chloride reaction product may then be delivered to the chamber 102. The reactive chloride product first enters a tube 122 where it evenly distributes within the tube 122. The tube 122 is connected to another tube 124. The chloride reaction product enters the second tube 124 after it has been evenly distributed within the first tube 122. The chloride reaction product then enters into the chamber 102 where it mixes with the nitrogen containing gas to form a nitride layer on the substrate 116 that is disposed on a susceptor 114. In one embodiment, the susceptor 114 may comprise silicon carbide. The nitride layer may comprise gallium nitride or aluminum nitride for example. The other reaction product, such as nitrogen and chlorine, is exhausted through an exhaust 126.

The chamber 102 may have a thermal gradient that can lead to a buoyancy effect. For example, the nitrogen based gas is introduced through the gas distribution showerhead 106 at a temperature between about 450 degrees Celsius and about 550 degrees Celsius. The chamber walls 108 may have a temperature of about 600 degrees Celsius to about 700 degrees Celsius. The susceptor 114 may have a temperature of about 1050 to about 1150 degrees Celsius. Thus, the temperature difference within the chamber 102 may permit the gas to rise within the chamber 102 as it is heated and then fall as it cools. The raising and falling of the gas may cause the nitrogen gas and the chloride gas to mix. Additionally, the buoyancy effect will reduce the amount of gallium nitride or aluminum nitride that deposits on the walls 108 because of the mixing.

The heating of the processing chamber 102 is accomplished by heating the susceptor 114 with a lamp module 128 that is disposed below the susceptor 114. During deposition, the lamp module 128 is the main source of heat for the processing chamber 102. While shown and described as a lamp module 128, it is to be understood that other heating sources may be used. Additional heating of the processing chamber 102 may be accomplished by use of a heater 130 embedded within the walls 108 of the chamber 102. The heater 130 embedded in the walls 108 may provide little if any heat during the deposition process. A thermocouple may be used to measure the temperature inside the processing chamber. Output from the thermocouple may be fed back to a controller that controls the heating of the heater 130 based upon the reading from the thermocouple. For example, if the chamber is too cool, the heater 130 will be turned on. If the chamber is too hot, the heater 130 will be turned off. Additionally, the amount of heating from the heater 130 may be controlled such that a low amount of heat is provided from the heater 130.

After the deposition process, the substrate 116 is normally taken out of the processing chamber 102. The lamp module 128 is turned off. Without the heat from the lamp module 128, the chamber 102 may rapidly cool. The gallium nitride or aluminum nitride that may have deposited on the walls 108 may have a different coefficient of thermal expansion than the walls 108 themselves. Thus, the gallium nitride or the aluminum nitride may flake off due to thermal expansion. To prevent undesired flaking, the heater 130 embedded within the chamber walls 108 may be turned on to control the thermal expansion and maintain the chamber 102 at the desired chamber temperature. The control of the heater 130 may again be based upon real time feedback from the thermocouple. Once the lamp module 128 is turned off, the heater 130 may be turned on or up to maintain the temperature of the chamber 102 at the desired temperature so that gallium nitride or aluminum nitride may not flake off and contaminate the substrate or land on the susceptor 114 and create an uneven susceptor 114 surface. By maintaining the chamber walls 108 at an elevated temperature, the chlorine will be more effective in cleaning the depositions from the chamber walls 108.

In general, a deposition process will proceed as follows. A substrate 116 may initially be inserted into the processing chamber 102 and disposed on the susceptor 114. In one embodiment, the substrate 116 may comprise sapphire. The lamp module 128 may be turned on to heat the substrate 16 and correspondingly the chamber 102. Nitrogen containing reactive gas may be introduced from a first source 110 to the processing chamber. The nitrogen containing gas may pass through an energy source 112 such as a gas heater to bring the nitrogen containing gas into a more reactive state. The nitrogen containing gas then passes through the chamber lid 104 and the gas distribution showerhead 106. In one embodiment, the chamber lid 104 may be water cooled.

A precursor may also be delivered to the chamber 102. A chlorine containing gas may pass through and/or over the precursor in a precursor source 118. The chlorine containing gas then reacts with the precursor to form a chloride. The chloride his heated with a resistive heater 120 in the source module 132 and then delivered into an upper tube 122 where it evenly distributes within the tube 122. The chloride gas then flows down into the other tube 124 before it is introduced into the interior of the chamber 102. It is to be understood that while chlorine containing gas has been discussed, the invention is not to be limited to chlorine containing gas. Rather, other compounds may be used in the HVPE process. The chamber walls 118 may have a minimal amount of heat generated from the heater 130 embedded within the walls 118. The majority of the heat within the chamber 120 is generated by the lamp module 128 below the susceptor 114.

Due to the thermal gradient within the chamber 102, the chloride gas and the nitrogen containing gas rise and fall within the processing chamber 102 and thus intermix to form a nitride compound that is deposited on the substrate 116. In addition to depositing on the substrate 116, the nitride layer may deposit on other exposed areas of the chamber 102 as well. The gaseous reaction product of the chloride compound and the nitrogen containing gas may include chlorine and nitrogen which may be evacuated out of the chamber thought the vacuum exhaust 126.

Once the deposition process is completed, the lamp module 128 may be turned off and the heater 130 output may be increased. The substrate 116 may be removed. The heater 130 output reduces or eliminates thermal expansion and thus any deposited nitride material may remain in place until the desired cleaning time and not flake off of the walls 108 and land on the susceptor 114 of incoming/outgoing substrate 116. Once the deposition process is completed, any nitride that has deposited on the walls 108 may be removed by introducing an etchant to etch the nitride off of the walls 108. During the cleaning, the lamp module 128 may be turned off and the majority of the heat may be from the heater 130 embedded within the walls 108. Once a new substrate 116 is placed into the chamber 102, the process may be repeated.

While the nitrogen containing gas is discussed as being introduced through the gas distribution showerhead 106 and the precursor delivered in the area corresponding to the middle of the chamber 102, it is to be understood that the gas introduction locations may be reversed. However, if the precursor is introduced through the showerhead 106, the showerhead 106 may be heated to increase the reactiveness of the chloride reaction product.

Because the chloride reaction product and the ammonia are delivered at different temperatures, delivering the ammonia and the chloride reaction product through a common feed may be problematic. For example, if a quartz showerhead were used to feed both the ammonia and the chloride reaction product, the quartz showerhead may crack due to the different temperatures of the ammonia and the chloride reaction product.

Additionally, the deposition process may involve depositing a thin aluminum nitride layer as a seed layer over the sapphire substrate followed by a gallium nitride layer. Both the gallium nitride and the aluminum nitride may be deposited within the same processing chamber. Thereafter, the sapphire substrate may be removed and placed into an MOCVD processing chamber were another layer may be deposited. In some embodiments, the aluminum nitride layer may be eliminated. Where both an aluminum nitride layer and a gallium nitride layer are deposited within the same chamber, a diatomic nitrogen back flow may be used to prevent any of the other precursor from reacting with chlorine and forming a chloride reaction product. The diatomic nitrogen may be flowed into the chamber of the precursor not being reacted while the chlorine may be flowed into contact with the other precursor. Thus, only one precursor is reacted at a time.

Figure 2:
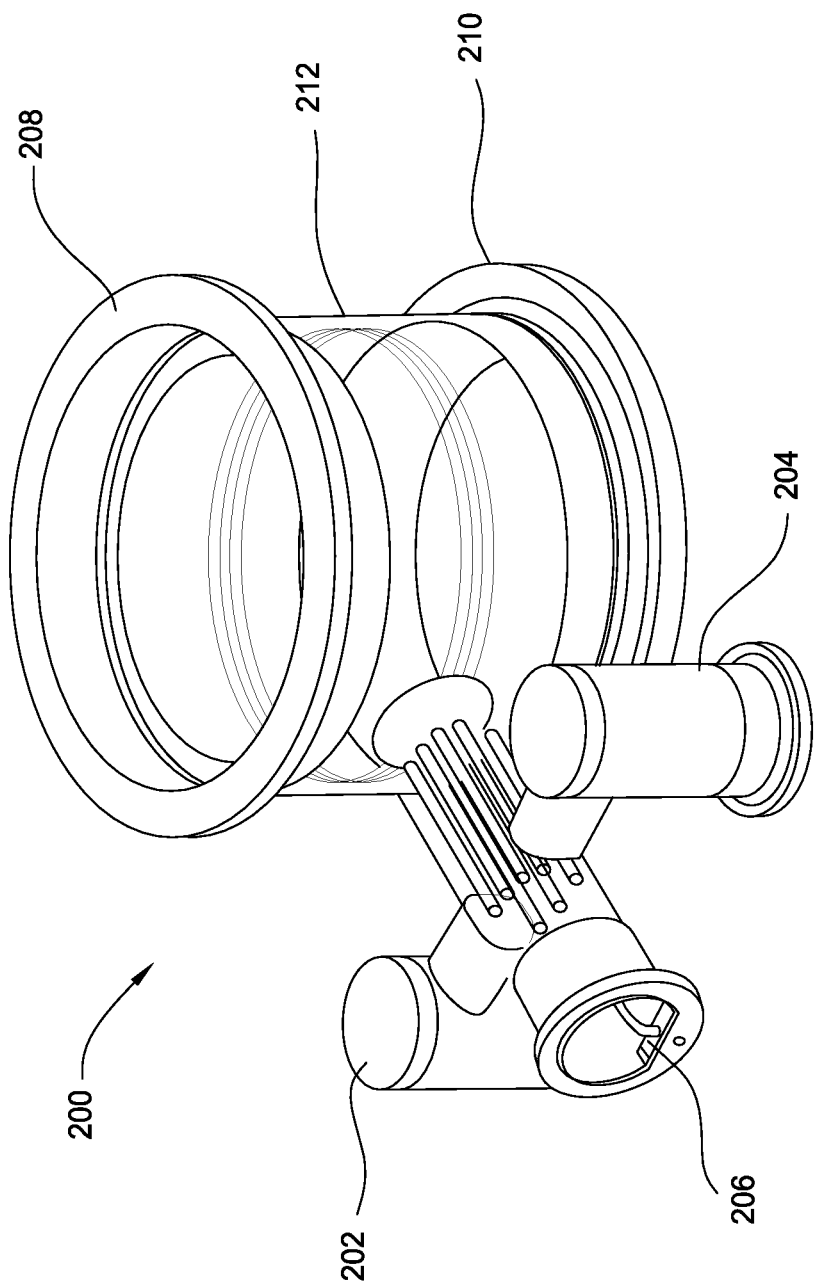
FIG. 2 is a schematic isometric view of a processing chamber 200 according to another embodiment.

FIG. 2 is a schematic isometric view of a processing chamber 200 according to another embodiment. The processing chamber 200 includes a first precursor source 202, a second precursor source 204, a passageway 206 for the reactive gas to pass, an upper ring 208, a lower ring 210, and sidewalls 212. In one embodiment, the upper and lower rings 208, 210 comprise opaque quartz. In one embodiment, the walls 212 may comprise clear quartz. The rings 208, 210 may have lips that extend out from the walls 212. O-rings may be disposed out at the edge of the lips to ensure that the O-rings are as far away from the heated chamber walls 212 and lamp module as possible. O-rings typically are usable up until about 250 degrees Celsius. Therefore, moving the O-rings away from the chamber body is beneficial.

Figure 3A:
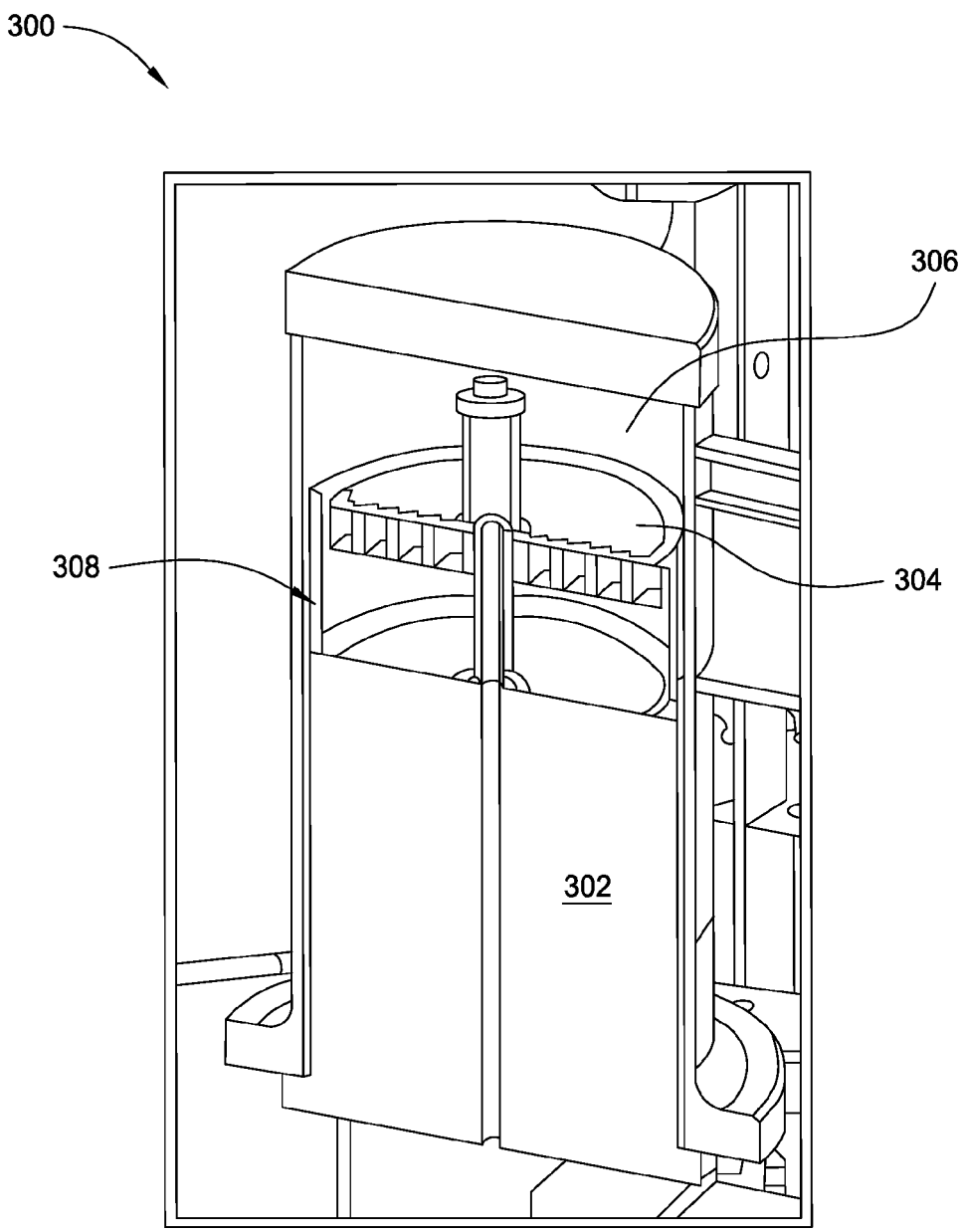
FIG. 3A is a schematic cross sectional view of a precursor source 300 according to one embodiment.
Figure 3B:
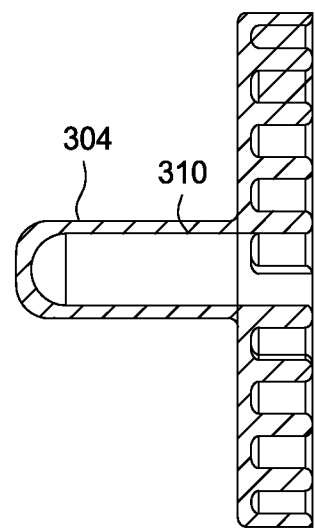
FIG. 3B schematic cross sectional view of the float of FIG. 3A.
Figure 3C:
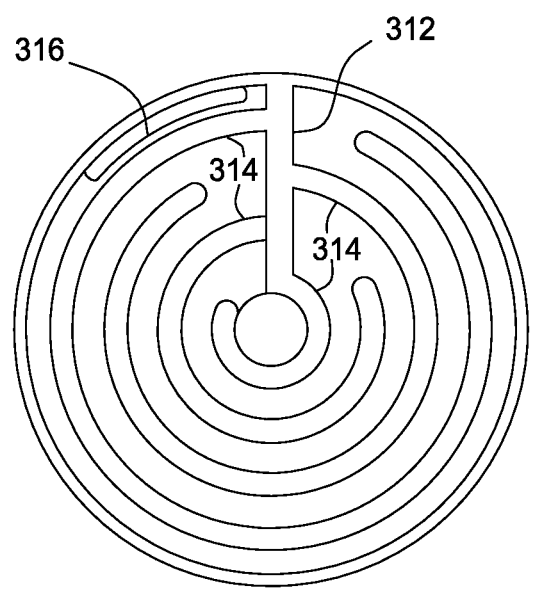
FIG. 3C is a schematic bottom view of the float of FIG. 3A.
Figure 3D:
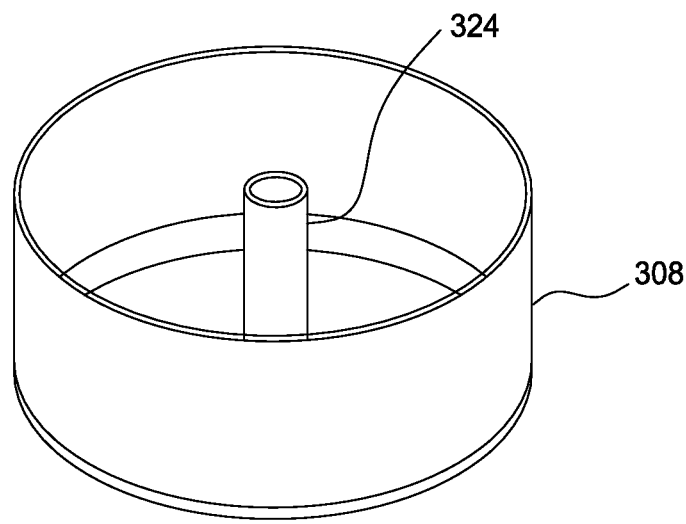
FIG. 3D is a schematic isometric view of the float liner FIG. 3A.
Figure 3E:
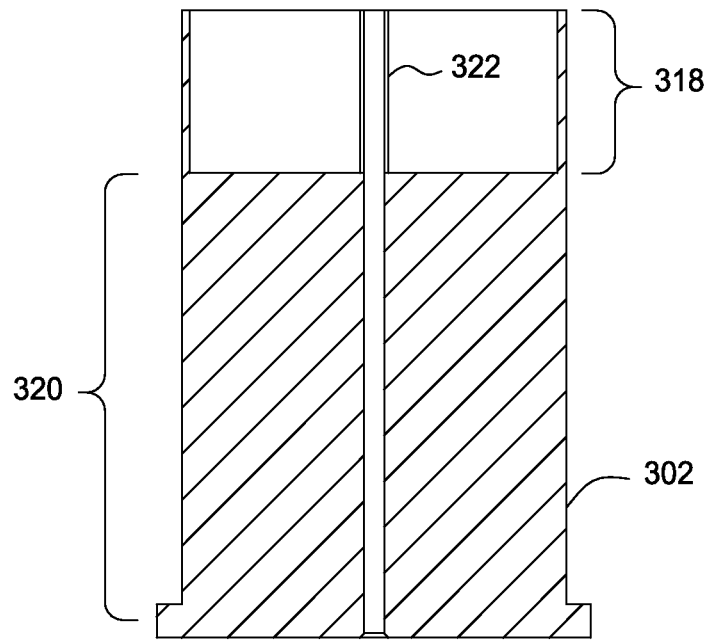
FIG. 3E is a schematic cross sectional view of the support liner of FIG. 3A.

FIG. 3A is a schematic cross sectional view of a precursor source 300 according to one embodiment. FIG. 3B schematic cross sectional view of the float of FIG. 3A. FIG. 3C is a schematic bottom view of the float of FIG. 3A. FIG. 3D is a schematic isometric view of the float liner of FIG. 3A. FIG. 3E is a schematic cross sectional view of the support liner of FIG. 3A. In the embodiment discussed herein, the precursor is gallium, however, it is to be understood that the description is applicable to any liquid precursor. The precursor source 300 includes the precursor itself with a float 304 thereon. The float 304 is the item that the chlorine gas flows through to come into contact with the precursor. The float 304 is disposed over a float liner 308 which rests on a support liner 302. The precursor is disposed within the float liner 308. As shown in FIG. 3D, the float liner 308 has a wall 324 that extends upward. The float 304 has a flange 310 with a passage therein into which the wall 324 of the float liner 308 extends as the float 304 sinks into the float liner 308. The wall 324 of the float liner 308 surrounds a gas passage to permit the reactive gas, such as chlorine, to enter the precursor source 300. Once the reactive gas has reacted with the precursor, the reaction product exits the precursor source 300 and is fed to the processing chamber.

In one embodiment, the float 304 comprises pyrolytic boron nitride (PBN). In another embodiment, the float 304 comprises PBN-graphite. In another embodiment, the float 304 comprises graphite. In one embodiment, the float liner 308 may comprise PBN. In another embodiment, the float liner 308 may comprise PBN-graphite. In another embodiment, the float liner 308 may comprise graphite. The float 304 has a flange 310 that extends vertically upward and is perpendicular to the bottom of the float liner 308. The float 304 has a plurality of grooves formed therein. The grooves include a center trunk groove 312 that extends in a radial direction from the substantial edge of the float 304 towards the middle of the float 304. A plurality of circular grooves 314 extend from the center trunk groove 312. As shown in FIG. 3B, the grooves extend to the flange 310 such that the reactive gas first enters the float 304 through the flange 310 and then distributes out through the grooves such as the center trunk groove 314 and the circular grooves 314. The reactive product then leaves the precursor source 300 through an opening 316 formed through the float 304. The opening 316 is shown at the substantial edge of the float 304.

As the reactive gas, such as chlorine, comes into contact with the precursor, some of the precursor will be used. Thus, the liquid level will drop over time. As such, the float 304 will move down and float on the precursor such that the exposure of chlorine gas to the precursor is substantially the same even as the level of the precursor drops. The area 306 above the float 304 may increase as the precursor decreases. The materials for the float 304 may comprise PBN to eliminate quartz exposure to gallium. The float 304 rests on the precursor which is in the float liner 308 that rests on a support liner 302. In one embodiment, the support liner 302 comprises quartz. As shown in FIG. 3E, the support liner 302 has a gas passage 322 therethrough for the reactive gas to pass therethrough. The support liner 302 has an upper portion 318 within which the float liner 308 rests and a lower portion 320. The gas passage 322 extends through both the lower portion 320 and the upper portion 318. The wall 324 of the float liner 308 will surround the gas passage 322. Thus, not only will the wall 324 extend into the flange 310 of the float 304 as the float 304 sinks, but also the gas passage 322 will extend into the flange 322. The gas passage 322, like the support liner 302, may comprise quartz. However, because the gas passage 322 and support liner 302 are only exposed to the reactive gas, such as chlorine, and not the liquid precursor, quartz is an acceptable material to utilize.

In one embodiment, the float 304 has a total height of between about 40 mm and about 70 mm. The flange 310 may have an inner diameter of between about 13 mm to about 16 mm. Each of the circular grooves 314 permits the reactive gas to remain in contact with the metal source precursor and increases the residence time that the gas is exposed to the liquid. The float "floats" on the metal precursor and thus sinks as the level of the metal precursor reduces.

Figure 4A:
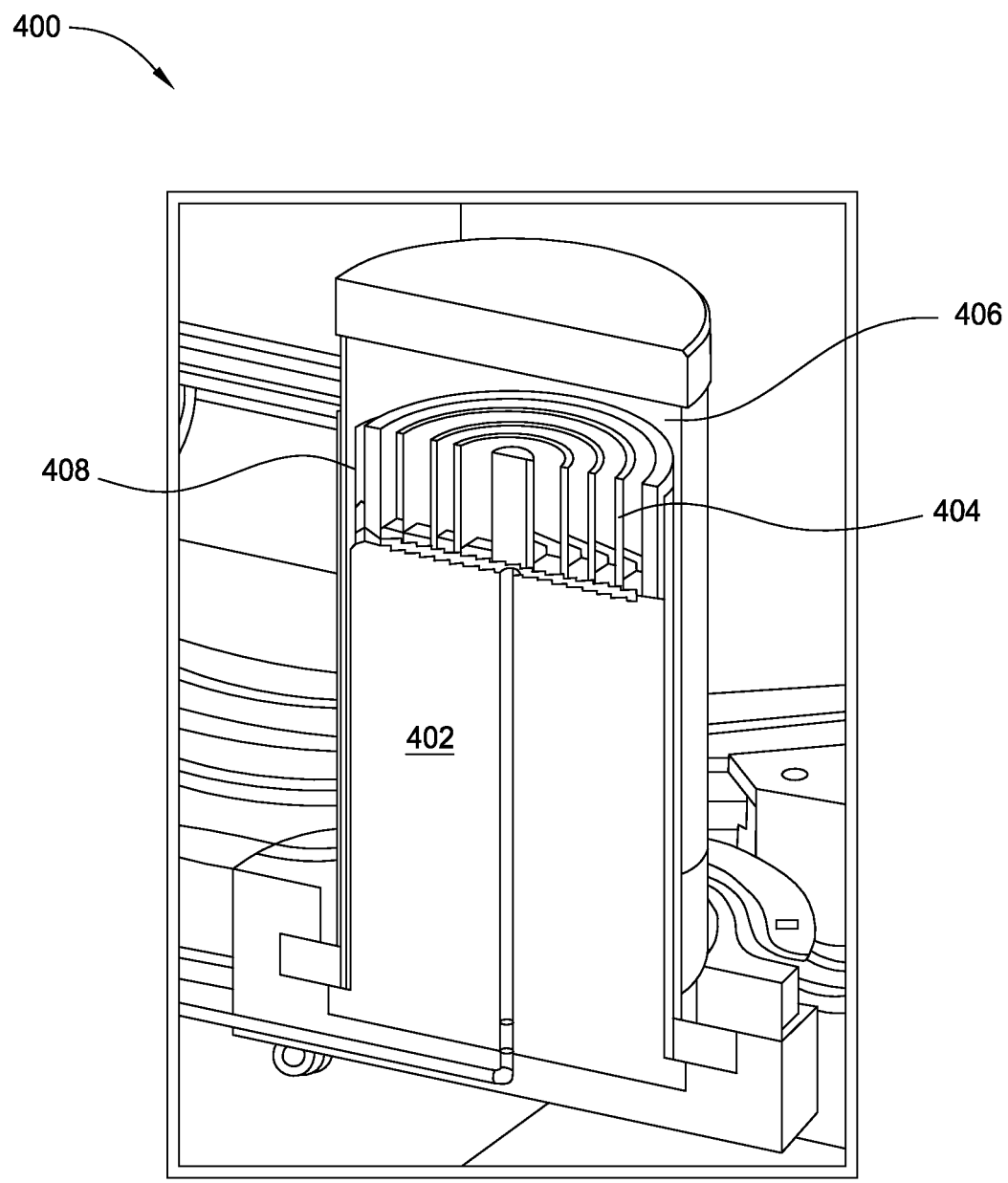
FIG. 4A is a schematic cross sectional view of a precursor source 400 according to another embodiment.
Figure 4B:
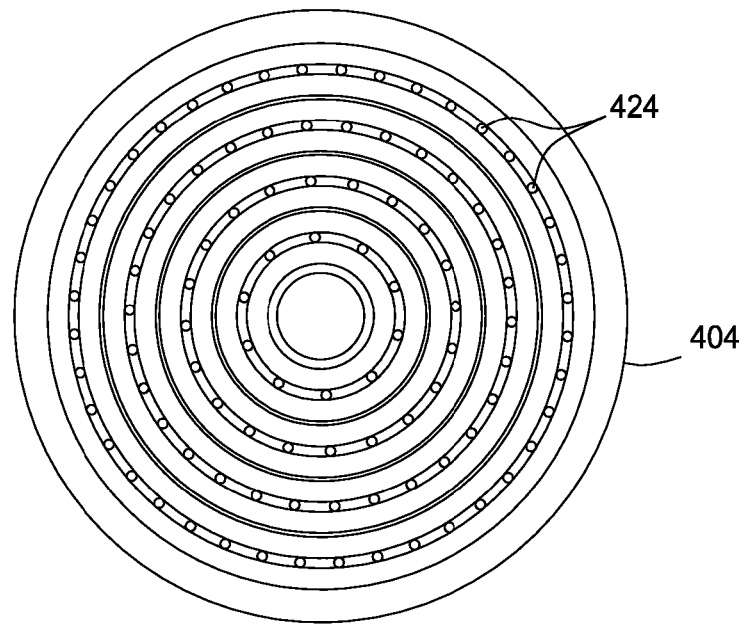
FIG. 4B is a schematic top view of the showerhead of FIG. 4A.
Figure 4C:
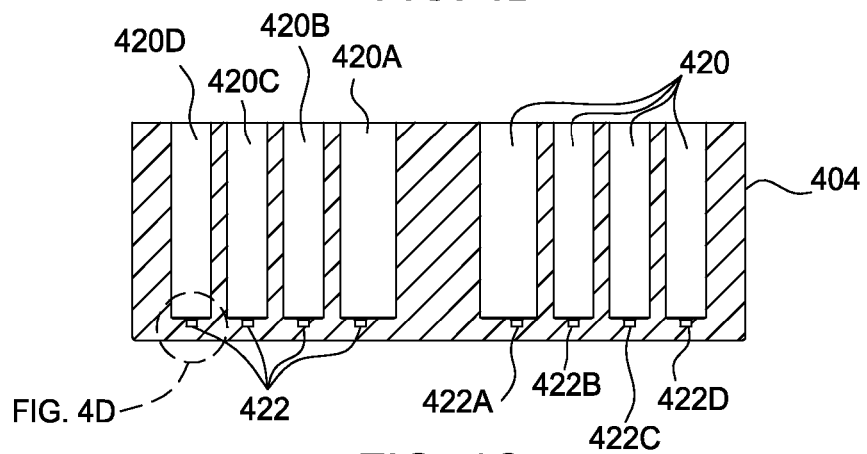
FIG. 4C is a schematic cross sectional view of the showerhead of FIG. 4A.
Figure 4D:
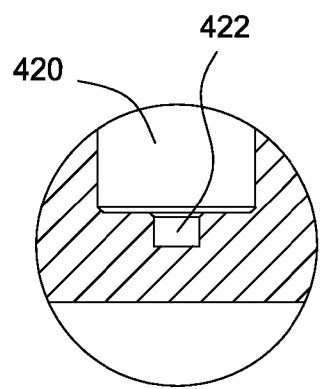
FIG. 4D is a detailed view of the showerhead of FIG. 4C.
Figure 4E:
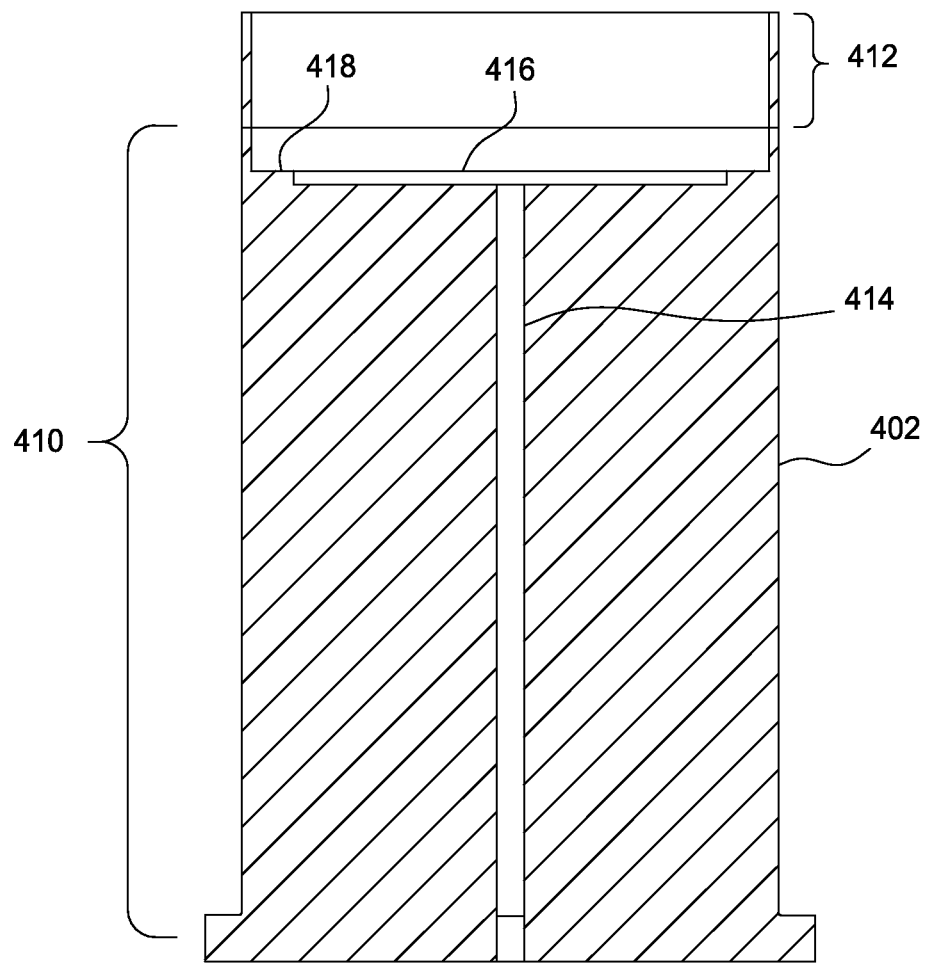
FIG. 4E is a schematic cross sectional view of the support liner of FIG. 4A.

FIG. 4A is a schematic cross sectional view of a precursor source 400 according to another embodiment. FIG. 4B is a schematic top view of the showerhead of FIG. 4A. FIG. 4C is a schematic cross sectional view of the showerhead of FIG. 4A. FIG. 4D is a detailed view of the showerhead of FIG. 4C. FIG. 4E is a schematic cross sectional view of the support liner of FIG. 4A. While the description will be made with reference to a solid, powder aluminum precursor, it is to be understood that the precursor may be any solid precursor. The precursor is below the showerhead 404 through which the reactive gas, such as chlorine gas, flows to come into contact with the precursor. The showerhead 404 increases the residence time that the chlorine gas is exposed to the precursor so that an optimal amount of precursor may be delivered to the processing chamber. As the showerhead 404 is not a float, the area 406 above the showerhead 404 is not expected to increase over time. The showerhead 404 rests in a support liner 402.

The support liner 402 has a lower portion 410 and an upper portion 412. In one embodiment, the lower portion 410 may comprise quartz. In another embodiment, the lower portion 410 may comprise opaque quartz. In one embodiment, the upper portion 412 may comprise quartz. In another embodiment, the upper portion 412 may comprise clear quartz. The lower portion 410 includes a gas passage 414 for the reactive gas or reactive product to pass therethrough. The lower portion 410 also includes a cavity 416 upon which the solid precursor may rest. The showerhead 404 may rest on a ledge 418 when the precursor source 400 is assembled.

The showerhead 404 has a plurality of concentric grooves 420. Each groove 420 has a corresponding groove 422. The grooves 420 have a width that is greater than the width of the smaller grooves 422. Within each groove 422, a plurality of gas passages 424 may be present that extend through the showerhead body. The gas passages 424 may be arranged in the innermost groove 422A to be spaced apart by between about 34 degrees to about 37 degrees. For the next adjacent groove 422B, the gas passages 424 may be spaced apart by between about 17 degrees and about 20 degrees. For the next groove 422C, the gas passages 424 may be spaced apart by between about 11 degrees and about 14 degrees. For the outermost groove 422D, the gas passages 424 may be spaced apart by between about 8 degrees to about 11 degrees. Within the showerhead body, the gas passages 424 for the grooves 422 all line up radially at about every 34 degrees to 37 degrees. Every other gas passage 424 in groove 424B lines up with a gas passage 424 for the groove 422A. Every third gas passage 424 of the groove 422C lines up with a gas passage 424 in groove 422A. Every fourth gas passage 424 in the outermost groove 422D lines up with a gas passage 424 in groove 422A.

In one embodiment, the showerhead 404 may comprise a ceramic material. In another embodiment, the showerhead 404 may comprise aluminum oxide. The showerhead body may have a diameter of between about 100 mm and about 110 mm. The outermost groove 420D, third groove 420C and second groove 420B may have a width of between about 13 mm to about 15 mm. The first groove 420A may have a width different from the other grooves 420B-D and may be between about 18 mm and about 21 mm. The showerhead 404 may have a total height of between about 38 mm and about 42 mm. Each groove 420 may have a height of between about 34 mm and about 37 mm such that the grooves 420 do not extend all the way to the bottom of the showerhead 404.

The embodiments discussed herein relate to a hot wall HVPE CVD reactor design that minimizes wall deposition while any deposited films adhered to the chamber wall are adhered well enough to manage defects on the product substrate. The chamber is configured such that two reactive gases may be introduced separately at desired preheated temperatures. The gas injection was designed such that the two gases mix mainly away from the wall, but provide enough diffusion length, volume and buoyancy to ensure ideal premixing and produce high quality films. The apparatus includes multiple metal sources heated by an independent heater and control, quartz or ceramic walls that incorporate the showerhead features. The apparatus is able to accommodate both liquid and solid precursors.

While the foregoing is directed to embodiments of the present invention, other and further embodiments of the invention may be devised without departing from the basic scope thereof, and the scope thereof is determined by the claims that follow.

The invention claimed is:

1. An apparatus for substrate processing, comprising: a vacuum chamber body; a first precursor source disposed adjacent to the vacuum chamber body and coupled to the vacuum chamber body, the first precursor source comprising: a first precursor source body; a first support liner disposed in the first precursor source body; a float liner coupled to the first support liner and disposed in the first precursor source body; and a float disposed in the first precursor source body and movable from a first position spaced a first distance from the float liner to a second position spaced a second distance from the float liner, the first distance greater than the second distance; and a second precursor source disposed adjacent the vacuum chamber body and coupled to the vacuum chamber body, the second precursor source separate from the first precursor source.

2. The apparatus of claim 1, wherein the first support liner comprises quartz.

3. The apparatus of claim 2, wherein the float liner comprises pyrolytic boron nitride.

4. The apparatus of claim 3, wherein the float comprises pyrolytic boron nitride.

5. The apparatus of claim 1, wherein the float has a plurality of grooves formed therein that face the float liner.

6. The apparatus of claim 5, wherein the plurality of grooves include:
a center trunk groove extending in a radial direction from the substantial edge of the float; and
one or more circular grooves extending from the center trunk groove.

7. The apparatus of claim 1, wherein the float liner comprises a center wall that extends substantially perpendicular to a bottom surface of the float liner, wherein the float comprises a central flange extending substantially parallel to the center wall of the float liner, and wherein the center wall of the float liner is disposed within the central flange of the float.

8. An apparatus for substrate processing, comprising: a vacuum chamber body; a first precursor source disposed adjacent to the vacuum chamber body and coupled to the vacuum chamber body, the first precursor source comprising: a first precursor source body; a first support liner disposed in the first precursor source body; and a showerhead disposed in the first precursor body and coupled to the first support liner; and a second precursor source disposed adjacent the vacuum chamber body and coupled to the vacuum chamber body, the second precursor source separate from the first precursor source.

9. The apparatus of claim 8, wherein the first support liner comprises quartz.

10. The apparatus of claim 9, wherein the showerhead comprises a ceramic material.

11. The apparatus of claim 8, wherein the showerhead comprises a showerhead body having a plurality of circular first grooves formed therein that each have a first width.

12. The apparatus of claim 11, wherein the showerhead body wherein each first groove has a second groove formed therein that has a second width that is less than the first width.

13. The apparatus of claim 12, wherein the showerhead body has one or more openings extending through the showerhead body from the second groove.

14. An apparatus for substrate processing, comprising: a vacuum chamber body; a first precursor source disposed adjacent to the vacuum chamber body and coupled to the vacuum chamber body, the first precursor source comprising: a first precursor source body; a first support liner disposed in the first precursor source body; a float liner coupled to the first support liner and disposed in the first precursor source body; and a float disposed in the first precursor source body and movable from a first position spaced a first distance from the float liner to a second position spaced a second distance from the float liner, the first distance greater than the second distance; and a second precursor source disposed adjacent the vacuum chamber body and coupled to the vacuum chamber body, the second precursor source separate from the first precursor source, the second precursor source comprising: a second precursor source body; a second support liner disposed in the first precursor source body; and a showerhead disposed in the first precursor body and coupled to the first support liner.

15. The apparatus of claim 14, wherein the first support liner comprises quartz, the float liner comprises pyrolytic boron nitride and the float comprises pyrolytic boron nitride.

16. The apparatus of claim 14, wherein the float has a plurality of grooves formed therein that face the float liner.

17. The apparatus of claim 16, wherein the plurality of grooves include:
a center trunk groove extending in a radial direction from the substantial edge of the float; and
one or more circular grooves extending from the center trunk groove.

18. The apparatus of claim 17, wherein the float liner comprises a center wall that extends substantially perpendicular to a bottom surface of the float liner, wherein the float comprises a central flange extending substantially parallel to the center wall of the float liner, and wherein the center wall of the float liner is disposed within the central flange of the float.

19. The apparatus of claim 14, wherein the first support liner comprises quartz and the showerhead comprises a ceramic material.

20. The apparatus of claim 14, wherein the showerhead comprises a showerhead body having a plurality of circular first grooves formed therein that each have a first width, wherein the showerhead body wherein each first groove has a second groove formed therein that has a second width that is less than the first width and wherein the showerhead body has one or more openings extending through the showerhead body from the second groove.

* * * * *